US012580331B2

(12) United States Patent
Yamada et al.

(10) Patent No.: US 12,580,331 B2
(45) Date of Patent: Mar. 17, 2026

(54) FLEXIBLE PRINTED WIRING BOARD WITH CRIMP TERMINAL

(71) Applicant: MEKTEC CORPORATION, Tokyo (JP)

(72) Inventors: Shuzo Yamada, Tokyo (JP); Yu Miura, Tokyo (JP); Tomoki Kanayama, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 308 days.

(21) Appl. No.: 17/182,390

(22) Filed: Feb. 23, 2021

(65) Prior Publication Data

US 2021/0313719 A1    Oct. 7, 2021

(30) Foreign Application Priority Data

Apr. 6, 2020    (JP) ................................. 2020-068061

(51) Int. Cl.
　*H01R 12/68*　　　(2011.01)
　*H01R 12/62*　　　(2011.01)
　　　　　　(Continued)

(52) U.S. Cl.
　CPC ............. *H01R 12/69* (2013.01); *H01R 12/62* (2013.01); *H01R 12/68* (2013.01); *H05K 3/361* (2013.01)

(58) Field of Classification Search
　None
　See application file for complete search history.

(56) References Cited

U.S. PATENT DOCUMENTS 6,309,241 B2 *  10/2001  Nagai .................... H01R 12/68
　　　　　　　　　　　　　　　　　439/422
6,565,376 B2 *   5/2003  Aoki ...................... H01R 12/68
　　　　　　　　　　　　　　　　　439/442

(Continued)

FOREIGN PATENT DOCUMENTS

CN　　　　1778153 A　　5/2006
CN　　　101346035 A　　1/2009
　　　　　　(Continued)

OTHER PUBLICATIONS

An Office Action; "Decision of Refusal," mailed by the Japanese Patent Office on Dec. 5, 2023, which corresponds to Japanese Patent Application No. 2020-068061 and is related to U.S. Appl. No. 17/182,390; with English language translation.

(Continued)

*Primary Examiner* — Felix O Figueroa
(74) *Attorney, Agent, or Firm* — Studebaker Brackett PLLC

(57)　　　　　　ABSTRACT

A flexible printed wiring board with crimp terminal includes: a flexible printed wiring board having a base film, a circuit including a metal foil provided on a surface of the base film, and a cover film attached to the base film so as to sandwich the circuit; and a crimp terminal with a plurality of crimping pieces that penetrates the flexible printed wiring board by being crimped and is bent to bite into a part of the circuit. A part of the circuit is exposed without the cover film being provided in a partial region of the flexible printed wiring board, and at least some of the crimping pieces are arranged in the partial region, and thus bite into a part of the circuit without penetrating the cover film.

3 Claims, 5 Drawing Sheets

(51) Int. Cl.
*H01R 12/69* (2011.01)
*H05K 3/36* (2006.01)

(56) References Cited

U.S. PATENT DOCUMENTS

| | | | | |
|---|---|---|---|---|
| 6,565,377 B2 * | 5/2003 | Sawayanagi | ........... | H01R 12/68 |
| | | | | 439/422 |
| 6,572,398 B2 * | 6/2003 | Onuma | .................. | H01R 12/68 |
| | | | | 439/422 |
| 7,329,141 B2 * | 2/2008 | Kumakura | ........... | H01R 12/616 |
| | | | | 439/422 |
| 7,581,979 B2 * | 9/2009 | Kumakura | ............. | H01R 4/185 |
| | | | | 174/117 FF |
| 11,942,708 B2 * | 3/2024 | Hirata | .................... | H05K 1/189 |
| 12,057,648 B2 * | 8/2024 | Aoyama | ................ | H01R 12/69 |
| 2001/0016449 A1 | 8/2001 | Aoki | | |
| 2006/0281343 A1 | 12/2006 | Uchida et al. | | |
| 2009/0014204 A1 | 1/2009 | Wang et al. | | |
| 2012/0099282 A1 | 4/2012 | Hasegawa | | |
| 2016/0204534 A1 | 7/2016 | Ishida et al. | | |

FOREIGN PATENT DOCUMENTS

| | | | |
|---|---|---|---|
| CN | 103748975 A | 4/2014 | |
| CN | 204836793 U | 12/2015 | |
| CN | 105493639 A | 4/2016 | |
| JP | S62-249370 A | 10/1987 | |
| JP | H05-29786 A | 2/1993 | |
| JP | 2803392 B2 | 9/1998 | |
| JP | 2001-230007 A | | 8/2001 |
| JP | 2003203703 A | * | 7/2003 |
| JP | 2010-282773 A | | 12/2010 |
| JP | 2012-089710 A | | 5/2012 |
| JP | 2013-045818 A | | 3/2013 |

OTHER PUBLICATIONS

An Office Action; "Notice of Reasons for Refusal," mailed by the Japanese Patent Office on Sep. 12, 2023, which corresponds to Japanese Patent Application No. 2020-068061 and is related to U.S. Appl. No. 17/182,390; with English language translation.

An Office Action mailed by China National Intellectual Property Administration on Jun. 30, 2025, which corresponds to Chinese Patent Application No. 202110217180.9 and is related to U.S. Appl. No. 17/182,390; with English language translation.

An Office Action mailed by China National Intellectual Property Administration on Oct. 25, 2025, which corresponds to Chinese Patent Application No. 202110217180.9 and is related to U.S. Appl. No. 17/182,390; with English language translation.

TE Connectivity, "Application Specification 114-94383 (Rev D1)," NanoMQS Terminal with FFC Crimp, Aug. 14, 2018, total 35 pages, TE Connectivity.

TE Connectivity, "Application Specification 114-94449 (Rev B)," General Guidelines for Application of Terminals with FFC-Crimp, Mar. 20, 2017, total 12 pages, TE Connectivity.

TE Connectivity, "Application Specification 114-94393 (Rev E)," NanoMQS FFC, Feb. 22, 2022, total 17 pages, TE Connectivity.

* cited by examiner

200

210

10

R

220

220

A      A

110

120

100

130

100     220   220     200     10

210

FLEXIBLE PRINTED WIRING BOARD WITH CRIMP TERMINAL

CROSS-REFERENCE TO RELATED APPLICATION

This application claims priority from Japanese Patent Application No. 2020-068061 filed with the Japan Patent Office on Apr. 6, 2020, the entire content of which is hereby incorporated by reference.

BACKGROUND

1. Technical Field

One aspect of the present disclosure relates to a flexible printed wiring board with crimp terminal.

2. Related Art

Conventionally, a technique for attaching the crimp terminal to the flexible printed wiring board has been known. The crimp terminal includes a plurality of crimping pieces that bites into a part of a circuit provided on the flexible printed wiring board (see Japanese Patent No. 2803392). In such a technique, the crimping piece is configured to penetrate a base film and a cover film of the flexible printed wiring board and to be bent to bite into the part of the circuit. Therefore, a contact area between the crimping pieces and the circuit is small, and electrical connection may be insufficient.

In a technology known for flexible flat cables, a part of a conductor is configured to protrude from a covering material, and the crimping piece is crimped to the part of the conductor. However, in the case of the flexible printed wiring board, strength of the conductor is low because the conductor is made of copper foil or the like. Therefore, it is difficult to apply such a technique to the flexible printed wiring board.

Examples of the prior art document of this case include JP-A-2003-203703 in addition to the above-mentioned Japanese Patent No. 2803392.

SUMMARY

A flexible printed wiring board with crimp terminal includes: a flexible printed wiring board having a base film, a circuit including a metal foil provided on a surface of the base film, and a cover film attached to the base film so as to sandwich the circuit; and a crimp terminal with a plurality of crimping pieces that penetrates the flexible printed wiring board by being crimped and is bent to bite into a part of the circuit. A part of the circuit is exposed without the cover film being provided in a partial region of the flexible printed wiring board, and at least some of the crimping pieces are arranged in the partial region, and thus bite into a part of the circuit without penetrating the cover film.

DETAILED DESCRIPTION

Figures 1A, 1B:
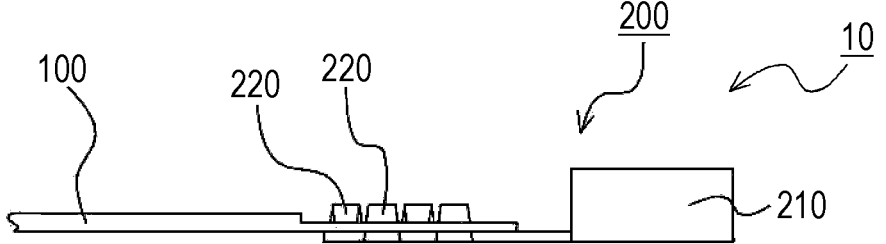
FIGS. 1A and 1B are schematic configuration diagrams of a flexible printed wiring board with crimp terminal according to Example 1 of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present disclosure is to provide a flexible printed wiring board with crimp terminal that enables stable electrical connection while maintaining strength.

In the present disclosure, the following configuration is employed.

That is, a flexible printed wiring board with crimp terminal according to the present disclosure (this flexible printed wiring board) includes: a flexible printed wiring board having a base film, a circuit including a metal foil provided on a surface of the base film, and a cover film attached to the base film so as to sandwich the circuit; and a crimp terminal with a plurality of crimping pieces that penetrates the flexible printed wiring board by being crimped and is bent to bite into a part of the circuit. A part of the circuit is exposed without the cover film being provided in a partial region of the flexible printed wiring board, and at least some of the crimping pieces are arranged in the partial region, and thus bite into a part of the circuit without penetrating the cover film.

According to the flexible printed wiring board, at least some of the crimping pieces are configured to bite into an exposed portion of the circuit without penetrating the cover film. Therefore, a contact area between the crimping pieces and the circuit can be increased. Further, since the base film is also provided in this crimped portion, the strength is also ensured.

In this flexible printed wiring board, it is preferred that all the crimping pieces are arranged in the partial region.

Further, in this flexible printed wiring board, it is preferred that at least some of the crimping pieces are arranged in a region other than the partial region, and the crimping pieces bite into a part of the circuit while penetrating the base film and the cover film.

If such a configuration is employed, the crimp terminal is attached to the flexible printed wiring board in a state where the strength is further ensured in a portion of the crimping piece arranged in the region other than the partial region.

In this flexible printed wiring board with, it is preferred that a boundary line with the partial region in the cover film is formed to be corrugated.

Thus, stress acting on the cover film can be dispersed.

As described above, according to the flexible printed wiring board, it is possible to enable the stable electrical connection while maintaining the strength.

Hereinafter, embodiments for carrying out a technique of the present disclosure will be exemplarily described in detail based on examples with reference to the drawings. However, unless otherwise specified, dimensions, materials, shapes, and relative arrangements of components described in the examples are not intended to limit the scope of the present disclosure to them.

Example 1

Figure 2A:
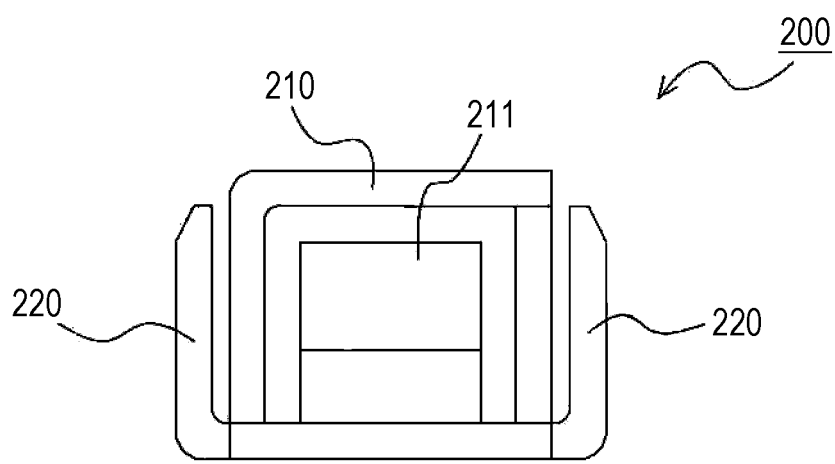
FIGS. 2A and 2B are schematic configuration diagrams of the crimp terminal according to Example 1 of the present disclosure.
Figure 2B:
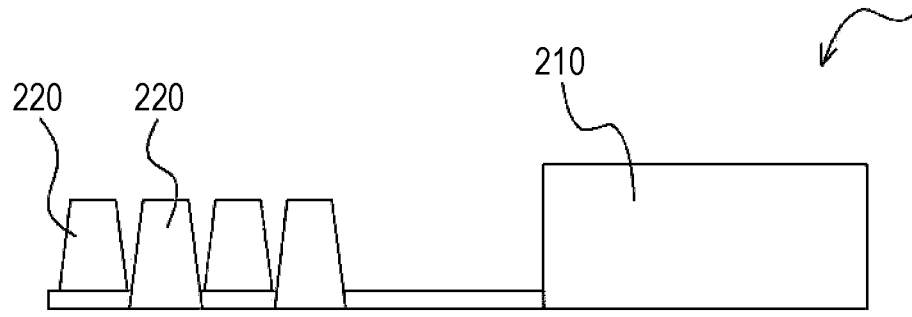
Figure 3:
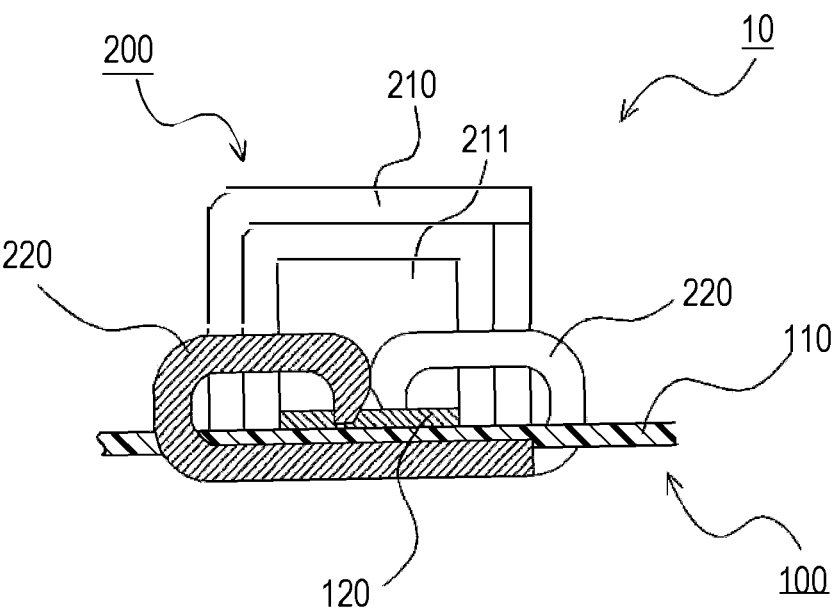
FIG. 3 is a schematic cross-sectional view of the flexible printed wiring board with crimp terminal according to Example 1 of the present disclosure.

The flexible printed wiring board with crimp terminal according to Example 1 of the present disclosure will be described with reference to FIGS. 1A, 1B, 2A, 2B and 3. FIGS. 1A and 1B are schematic configuration diagrams of the flexible printed wiring board with crimp terminal according to Example 1 of the present disclosure. FIG. 1A illustrates a part of a plan view of the flexible printed wiring board with crimp terminal. FIG. 1B illustrates a part of a side view of the flexible printed wiring board with crimp terminal. FIGS. 2A and 2B are schematic configuration diagrams of the crimp terminal according to Example 1 of the present disclosure. FIG. 2A illustrates a rear end of the crimp terminal. FIG. 2B illustrates a side view of the crimp terminal. FIG. 3 is a schematic cross-sectional view of the flexible printed wiring board with crimp terminal according to Example 1 of the present disclosure, and is an A-A cross-sectional view in FIG. 1A. Note that FIGS. 2A and 2B illustrate the crimp terminal before crimping. On the other hand, FIGS. 1A, 1B and 3 illustrate the crimp terminal after being crimped.

Flexible printed wiring board with crimp terminal A configuration of the flexible printed wiring board with crimp terminal (hereinafter, appropriately referred to as "FPC 10 with terminal") according to the present example will be described. The FPC 10 with terminal includes a flexible printed wiring board (hereinafter, referred to as "FPC 100") and crimp terminals 200 attached to the FPC 100.

The FPC 100 includes a base film 110, a circuit 120 including a metal foil (copper foil or the like) provided on a surface of the base film 110, and a cover film 130 that is attached to the base film 110 so as to sandwich the circuit 120. Between the base film 110 and the cover film 130, an adhesive layer (not shown) for attaching them is generally formed. Then, the FPC 10 with terminal is configured so that a part of the circuit 120 is exposed without the cover film 130 being provided in a partial region of the FPC 100. Hereinafter, the "partial region" will be referred to as an "exposed region R".

The crimp terminal 200 is attached to the FPC 100 by a crimping jig or a crimping device (not shown). In an example shown in this example, four crimp terminals 200 are attached to the FPC 100. However, needless to say, the number of crimp terminals 200 attached to the FPC 100 varies depending on a product.

In this example, a case where the crimp terminal 200 is a female terminal is shown. The crimp terminal 200, which is the female terminal, includes a box portion 210 into which a terminal tip of a male terminal is inserted, and a tongue piece 211 for elastically sandwiching the terminal tip of the male terminal. Then, the crimp terminal 200 according to this example includes a plurality of crimping pieces 220. The crimping pieces 220 are provided to be arranged alternately on both sides in a width direction (direction perpendicular to a direction from a terminal tip to a rear end of the female terminal). Note that in the configuration shown in this example, four crimping pieces 220 are provided. In this regard, the number of crimping pieces 220 can be set as appropriate.

The crimping piece 220 is configured to penetrate the FPC 100 by being crimped and to be bent to bite into the part of the circuit 120. Note that in this example, various known crimp terminals with the crimping pieces 220 as described above can be employed as the crimp terminal 200. Further, in this example, the case where the crimp terminal is the female terminal is shown. In this regard, the crimp terminal according to the embodiments of the present disclosure can also be applied to the male terminal with similar crimping pieces.

Then, in the FPC 10 with terminal according to this example, all the crimping pieces 220 are configured to be arranged in the exposed region R (see FIG. 1A). Thus, all the crimping pieces 220 bite into the part of the circuit 120 without penetrating the cover film 130.

Advantages of flexible printed wiring board provided with crimp terminal according to this example According to the FPC 10 with terminal according to this example, all the crimping pieces 220 are configured to bite into the part of the exposed circuit 120 without penetrating the cover film 130. Therefore, the contact area between the crimping pieces 220 and the circuit 120 can be increased.

That is, when the crimping pieces 220 bite into the part of the circuit 120 while penetrating the cover film 130, a part of the cover film 130 easily gets into a vicinity of a connection portion between the crimping pieces 220 and the circuit 120. Therefore, the contact area between the crimping pieces 220 and the circuit 120 tends to be reduced.

In contrast, the contact area between the crimping pieces 220 and the circuit 120 can be increased by employing a configuration in which the crimping pieces 220 bite into the part of the exposed circuit 120. Therefore, it is possible to stabilize the electrical connection. Further, since the base film 110 is also provided in the crimped portion, the strength is also ensured. Therefore, it is possible to enable the stable electrical connection while maintaining the strength.

As described above, according to the FPC 10 with terminal according to this example, it is possible to realize the stable electrical connection while maintaining the strength. Therefore, the FPC 10 with terminal according to this example can be suitably used for voltage monitoring of an automobile battery on which vibration or shock is likely to act. However, the FPC 10 with terminal according to this example is not limited to such an application, and can be applied to various devices.

Example 2

Figure 4A:
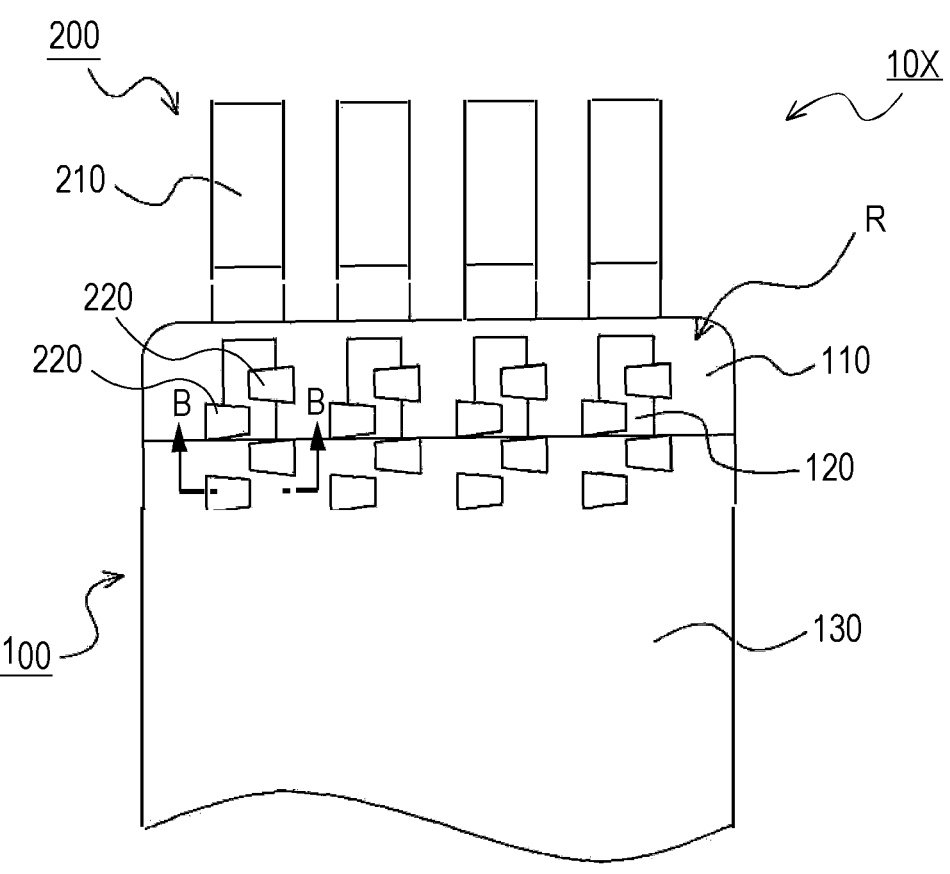
FIGS. 4A and 4B are schematic configuration diagrams of the flexible printed wiring board with crimp terminal according to Example 2 of the present disclosure.
Figure 4B:
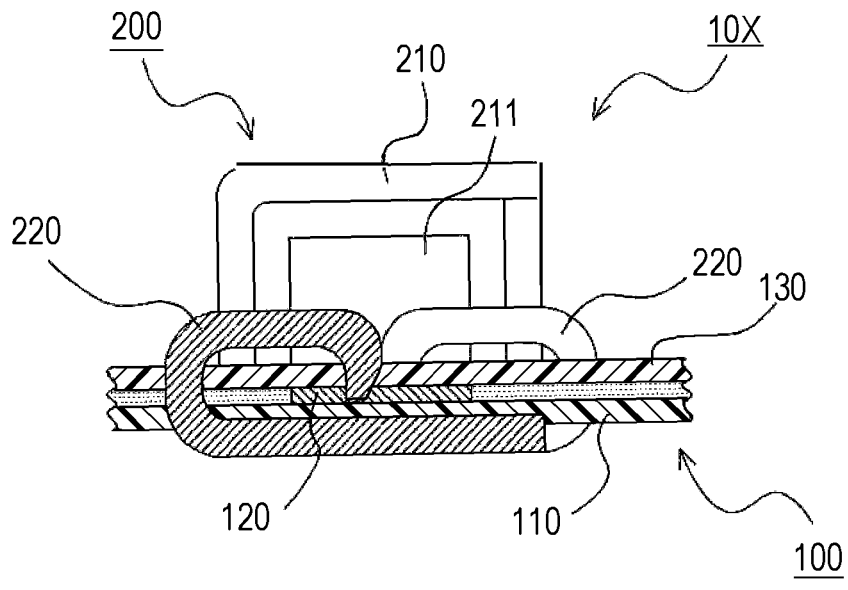

FIGS. 4A and 4B illustrate Example 2 of the present disclosure. In the above Example 1, the configuration is shown in which all the crimping pieces are arranged in the exposed region R. On the other hand, in this example, a configuration is shown in which at least some of the crimping pieces are arranged in a region other than the exposed region. Other configurations and operations are the same as in Example 1. Therefore, the same components are denoted by the same reference numerals, and description thereof will be omitted.

FIGS. 4A and 4B are schematic configuration diagrams of the flexible printed wiring board with crimp terminal according to Example 2 of the present disclosure. FIG. 4A illustrates a part of a plan view of the flexible printed wiring board with crimp terminal. FIG. 4B is a schematic cross-sectional view of the flexible printed wiring board provided with crimp terminal, and is a B-B cross-sectional view in FIG. 4A.

The configuration of the flexible printed wiring board with crimp terminal (hereinafter, appropriately referred to as "FPC 10X with terminal") according to this example will be described. The FPC 10X with terminal according to this example also includes the FPC 100 and the crimp terminals 200 attached to the FPC 100 as in the case of Example 1. A basic configuration of the FPC 100 is the same as that of the above Example 1. Further, a configuration of the crimp terminal 200 is also the same as that of the above Example 1. Therefore, descriptions of these configurations will be omitted.

Then, in the FPC 10X with terminal according to this example, at least some of the crimping pieces 220 are arranged in the exposed region R. On the other hand, the remaining crimping pieces 220 are arranged in a region other than the exposed region R. In this example, the two crimping pieces 220 are arranged in the exposed region R, while the remaining two crimping pieces 220 are arranged in the region other than the exposed region R. However, in the embodiments of the present disclosure, distribution of the crimping pieces arranged in the exposed region R and the crimping pieces arranged in the region other than the exposed region R is not particularly limited.

A crimped state of the crimping pieces 220 arranged in the exposed region R is as described in Example 1. Then, the crimping pieces 220 arranged in the region other than the exposed region R bite into the part of the circuit 120 while penetrating the base film 110 and the cover film 130.

As described above, according to the FPC 10X with terminal according to this example, the same effect as that of Example 1 can be obtained by the crimping pieces 220 arranged in the exposed region R. Then, the crimp terminal 200 can be attached to the FPC 100 in a state where the strength is further ensured by the crimping pieces 220 arranged in the region other than the exposed region R.

Here, the crimping pieces 220 arranged in the exposed region R have excellent stability of the electrical connection, although they are inferior in strength. On the other hand, the crimping pieces 220 arranged in the region other than the exposed region R have excellent strength, although they are inferior in stability of the electrical connection. Therefore, in consideration of these balances, it is preferable to set the distribution of the crimping pieces 220 arranged in the exposed region R and the crimping pieces 220 arranged in the region other than the exposed region R depending on usage environment or the like.

Example 3

Figure 5:
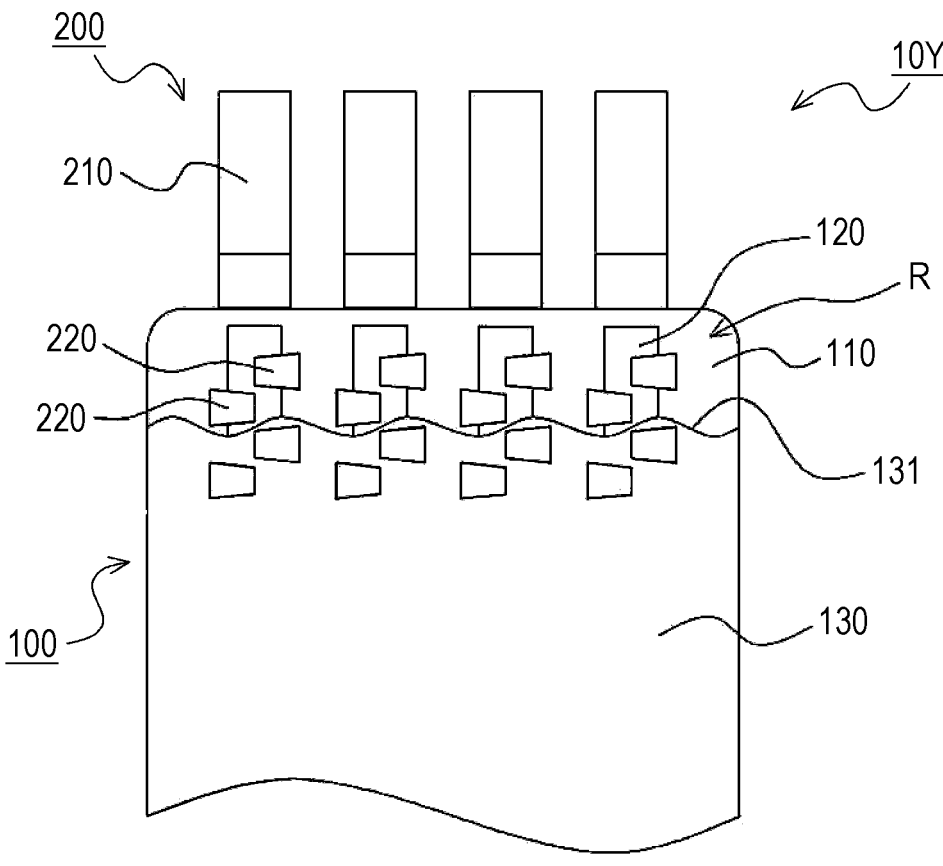
FIG. 5 is a schematic configuration diagram of the flexible printed wiring board with crimp terminal according to Example 3 of the present disclosure.

FIG. 5 illustrates Example 3 of the present disclosure. In the configuration shown in this example, the boundary line with the above-mentioned partial region (exposed region) in the cover film is formed to be corrugated in the configuration shown in the above Example 2. Other configurations and operations are the same as in Examples 1 and 2. Therefore, the same components are denoted by the same reference numerals, and the description thereof will be omitted.

FIG. 5 is a schematic configuration diagram of the flexible printed wiring board with crimp terminal according to Example 3 of the present disclosure. More specifically, FIG. 5 illustrates a part of a plan view of the flexible printed wiring board with crimp terminal.

The configuration of the flexible printed wiring board with crimp terminal (hereinafter, appropriately referred to as "FPC 10Y with terminal") according to this example will be described. The FPC 10Y with terminal according to this example also includes the FPC 100 and the crimp terminals 200 attached to the FPC 100 as in the cases of Examples 1 and 2. The basic configuration of the FPC 100 is the same as that of the above Example 1. Further, the configuration of the crimp terminal 200 is also the same as that of the above Example 1. Therefore, the descriptions of these configurations will be omitted.

Then, in the above Example 2, the boundary line with the exposed region R in the cover film 130 is formed to be a straight line. On the other hand, in this example, a boundary line 131 with the exposed region R in the cover film 130 is formed to be corrugated. Example 3 is different from the above Example 2 only in this respect.

Needless to say, even in the FPC 10Y with terminal according to this example configured as described above, the same effect as in the case of the above Example 2 can be obtained. Further, in the case of this example, the boundary line 131 with the exposed region R in the cover film 130 is formed to be corrugated. Therefore, the stress acting on the cover film 130 can be dispersed. Therefore, it is possible to more reliably prevent the cover film 130 from peeling off.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed wiring board with crimp terminal, comprising:
a flexible printed wiring board having a base film, a plurality of circuits including a metal foil provided on a surface of the base film, and a cover film attached to the base film so as to sandwich the circuits; and
a plurality of crimp terminals each including a plurality of crimping pieces, wherein
the circuits extend in a long direction along a length of the circuits and in a short direction, perpendicular to the long direction, along a width of the circuits;
each of the circuits includes a first part and a second part,
the first part of the circuits is exposed without covering by the cover film in a first area of the flexible printed wiring board, the cover film is provided in a second area of the flexible printed wiring board which is different from the first area, and the cover film covers the second part of the circuits in the second area,
some of the crimping pieces are arranged in the first area and penetrate the base film without penetrating the cover film and the first part of the circuits by being crimped, and are then bent to bite into the first part of the circuits,
the crimping pieces other than the some of the crimping pieces are arranged in the second area and penetrate the base film and the cover film without penetrating the second part of the circuits by being crimped, and are then bent to bite into the second part of the circuits,
an entirety of a respective one of the circuits is in between the crimping pieces adjacent to each other in the short direction of the respective one of the circuits, and a distance between outermost ends of the crimping pieces adjacent to each other having the respective one of the circuits entirely in between in the short direction of the respective one of the circuits is greater than the width of the respective one of the circuits in the short direction of the respective one of the circuits, a boundary line with the first area in the cover film is formed to be corrugated as a corrugated boundary line in a plan view looking at a largest surface of the cover film, the corrugated boundary line having alternating peaks and troughs, the peaks protruding toward the first area, and the crimping pieces that penetrate the cover film include at least one crimping piece that is aligned with one of the peaks and intersects an imaginary line that extends between two of the troughs that are on opposite sides of the one of the peaks.

2. The flexible printed wiring board with crimp terminal according to claim 1, wherein the crimping pieces other than the some of the crimping pieces are arranged in the second area and penetrate the base film and the cover film without penetrating the second part of the circuits by being crimped, and are then bent to pass back through the cover film and bite into the second part of the circuits.

3. The flexible printed wiring board with crimp terminal according to claim 1, wherein the at least one crimping piece includes a group of crimping pieces, with each crimping piece in the group of crimping pieces being aligned with a respective one of the peaks and intersecting a respective imaginary line that extends between a respective two of the troughs that are on opposite sides of the respective one of the peaks.

* * * * *